(12) United States Patent
Yamaguchi et al.

(10) Patent No.: US 6,218,890 B1
(45) Date of Patent: Apr. 17, 2001

(54) SWITCHING CIRCUIT DEVICE AND SEMICONDUCTOR DEVICE

(75) Inventors: Tsutomu Yamaguchi, Nara; Seiichi Banba, Ohgaki; Tetsuro Sawai, Gifu-ken; Hisanori Uda, Nagoya, all of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/350,924

(22) Filed: Jul. 12, 1999

(30) Foreign Application Priority Data

Jul. 14, 1998 (JP) .................................. 10-198913
Feb. 3, 1999 (JP) .................................. 11-026650

(51) Int. Cl.$^7$ ............................................ H03K 17/687
(52) U.S. Cl. ............................................ 327/427; 327/431
(58) Field of Search ..................... 327/427, 431, 327/435, 434, 436; 333/101, 103, 104, 262

(56) References Cited

U.S. PATENT DOCUMENTS

| 4,890,077 | * | 12/1989 | Sun ........................................ 333/81 |
| 5,477,184 | | 12/1995 | Uda et al. ............................. 327/404 |
| 6,037,830 | * | 5/2000 | Mil'shtein et al. .................. 327/427 |

FOREIGN PATENT DOCUMENTS 8-70245    3/1996  (JP) .
10-242829  9/1998  (JP) .

* cited by examiner

Primary Examiner—Tuan T. Lam
Assistant Examiner—Linh Nguyen
(74) Attorney, Agent, or Firm—Armstrong, Westerman, Hattori, McLeland & Naughton

(57) ABSTRACT

A switching circuit device including a multi-gate field effect transistor having a plurality of gate electrodes between a drain electrode and a source electrode, a low resistor having its one end connected between the gate electrodes, and a high resistor connected between the other end of the low resistor and any one of the drain electrode, the source electrode and the end of the other low resistor.

20 Claims, 13 Drawing Sheets

F I G. 7
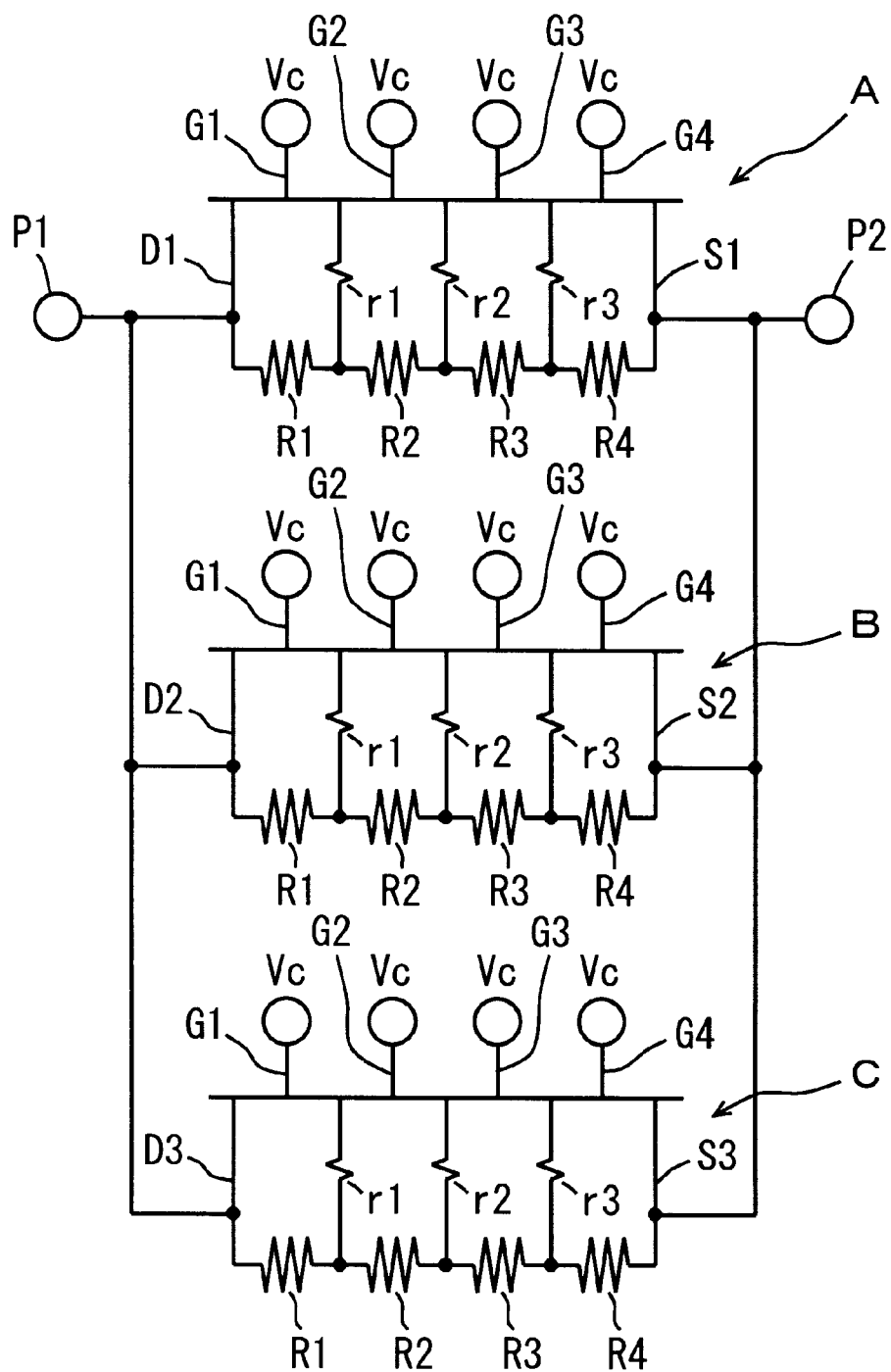

SWITCHING CIRCUIT DEVICE AND SEMICONDUCTOR DEVICE

BACKGROUND OF THE INVENTION

1. Field of the Invention

The present invention relates generally to a switching circuit device comprising a multi-gate field effect transistor (FET) and a semiconductor device for configuring the switching circuit device.

2. Description of the Background Art

For example, a GaAs switching circuit device capable of a high-speed switching operation is used for a transmitter-receiver in a microwave communication system. FIG. 17 is a diagram showing an example of a transmitter-receiver using a switching circuit device comprising a conventional MESFET (Metal-Semiconductor Field Effect Transistor; hereinafter abbreviated as FET).

The transmitter-receiver shown in FIG. 17 comprises a transmit-receive antenna 100, a transmitting circuit 110, and a receiving circuit 120. The transmit-receive antenna 100 and the transmitting circuit 110 are connected to each other through an switching circuit device 130 comprising a FET, and the transmit-receive antenna 100 and the receiving circuit 120 are connected to each other through a switching circuit device 140 comprising an FET. Control voltages V1 and V2 are respectively applied to gate electrodes G1 and G2 in the FETs constituting the switching circuit devices 130 and 140.

In such a transmitter-receiver, when the control voltage V1 is 0 volt, and the control voltage V2 is −10 volts, the switching circuit device 130 is turned on, and the switching circuit device 140 is turned off. Consequently, a transmission signal from the transmitting circuit 110 is transmitted to the antenna 100. On the other hand, when the control voltage V1 is −10 volts, and the control voltage V2 is 0 volts, the switching circuit device 130 is turned off, and the switching circuit device 140 is turned on. Consequently, a receiving signal received by the antenna 100 is transmitted to the receiving circuit 120.

In order to decrease the size and increase the performance of communication equipment in microwave communication, a switching circuit device capable of performing a low-voltage operation and providing high-output power transmission is required. The switching circuit device 130 in the above-mentioned transmitter-receiver is configured by connecting a plurality of FETs 131 to 134 in series, as shown in FIG. 18, so that large power can be turned on or off at a low control voltage V1. Similarly, the switching circuit device 140 is also configured by connecting a plurality of FETs 141 to 144 in series, so that a large power can be turned on or off at a low control voltage V2. As a result, the switching circuit devices 130 and 140 can perform a low-voltage operation and make high-output power. transmission. In FIG. 18, an interstage resistor RH is a resistor for keeping an interstage potential between the FETs constant.

When the number of stages of the FETs constituting the switching circuit device as described above is increased, however, an area occupied by the FETs is increased. Therefore, the size of the switching circuit device is increased.

In order to solve the above-mentioned disadvantage, a switching circuit device using a multi-gate FET having a plurality of gate electrodes between a drain electrode and a source electrode (between a set of ohmic electrodes) has been proposed in JP-A-9-238059.

In the switching circuit device described in the above-mentioned application, however, the chip size can be decreased, while an interstage potential between the gate electrodes cannot be kept constant. Therefore, the interstage potential between the gate electrodes becomes unstable. As a result, a portion between the drain electrode and the source electrode cannot be brought into a completely off state when the switching circuit device is turned off.

SUMMARY OF THE INVENTION

An object of the present invention is to provide a switching circuit device using a multi-gate FET capable of carrying out on-off control of large power in small size, and stabilizing a potential between gate electrodes and restraining a leakage signal between ohmic electrodes when it is turned off.

Another object of the present invention is to provide a semiconductor device which is suited to configure the above-mentioned switching circuit device.

A switching circuit device according to the present invention is a switching circuit device comprising a multi-gate field effect transistor, wherein the field effect transistor comprises a first ohmic electrode, a second ohmic electrode, a plurality of gate electrodes, a low resistor having its one end connected between the adjacent gate electrodes out of the plurality of gate electrodes, and a high resistor having a resistance value larger than the resistance value of the low resistor for changing an interstage potential between the adjacent gate electrodes into a predetermined potential through the low resistor.

In this case, the interstage potential between the adjacent gate electrodes out of the plurality of gate electrodes is stabilized upon being changed into a predetermined potential by the high resistor. Consequently, there can be provided a switching circuit device capable of carrying out on-off control of large power in small size and restraining a leakage signal between the ohmic electrodes in a case where it is turned off.

The plurality of gate electrodes may comprise a first gate electrode and a second gate electrode adjacent to the first gate electrode, the one end of the low resistor may be connected between the first gate electrode and the second gate electrode, and the high resistor may be connected between the other end of the low resistor and one of the first ohmic electrode and the second ohmic electrode.

In this case, the interstage potential between the first gate electrode and the second gate electrode is stabilized upon being equal to a potential at one of the first ohmic electrode and the second ohmic electrode by the high resistor.

The plurality of gate electrodes may comprise a first gate electrode and a second gate electrode adjacent to the first gate electrode, the high resistor may comprise a first high resistor and a second high resistor, the one end of the low resistor may be connected between the first gate electrode and the second gate electrode, the first high resistor may be connected to the other end of the low resistor and the first ohmic electrode, and the second high resistor may be connected between the other end of the low resistor and the second ohmic electrode.

In this case, the interstage potential between the first gate electrode and the second gate electrode is stabilized upon being equal to the potential at the first ohmic electrode and the potential at the second ohmic electrode by the first and second high resistors.

The plurality of gate electrodes may comprise a first gate electrode, a second gate electrode adjacent to the first gate electrode, and a third gate electrode adjacent to the second gate electrode, the low resistor may comprise a first low resistor and a second low resistor, the first low resistor may have its one end connected between the first gate electrode and the second gate electrode, the second low resistor may have its one end connected between the second gate electrode and the third gate electrode, and the high resistor may be connected to the other end of the first low resistor and the other end of the second low resistor.

In this case, the interstage potential between the first gate electrode and the second gate electrode and the interstage potential between the second gate electrode and the third gate electrode are equal to each other by the high resistor, so that both the interstage potentials are stabilized.

The plurality of gate electrodes may comprise a first gate electrode, a second gate electrode adjacent to the first gate electrode, and a third gate electrode adjacent to the second gate electrode, the low resistor may comprise a first low resistor and a second low resistor, the high resistor may comprise a first high resistor and a second high resistor, the first low resistor may have its one end connected between the first gate electrode and the second gate electrode, the second low resistor may have its one end connected between the second gate electrode and the third gate electrode, the first high resistor may be connected between the other end of the first low resistor and the first ohmic electrode, and the second high resistor may be connected between the other end of the second low resistor and the second ohmic electrode.

In this case, the interstage potential between the first gate electrode and the second gate electrode is equal to the potential at the first ohmic electrode by the first high resistor, and the interstage potential between the second gate electrode and the third gate electrode is equal to the potential at the second ohmic electrode by the second high resistor, so that both the interstage potentials are stabilized.

The plurality of gate electrodes may comprise a first gate electrode, a second gate electrode adjacent to the first gate electrode, and a third gate electrode adjacent to the second gate electrode, the low resistor may comprise a first low resistor and a second low resistor, the high resistor may comprise a first high resistor, a second high resistor, and a third high resistor, the first low resistor may have its one end connected between the first gate electrode and the second gate electrode, the second low resistor may have its one end connected between the second gate electrode and the third gate electrode, the first high resistor may be connected between the other end of the first low resistor and the first ohmic electrode, the second high resistor may be connected between the other end of the second low resistor and the second ohmic electrode, and the third high resistor may be connected between the other end of the first low resistor and the other end of the second low resistor.

In this case, the interstage potential between the first gate electrode and the second gate electrode and the interstage potential between the second gate electrode and the third gate electrode are equal to the potential at the first ohmic electrode and the potential at the second ohmic electrode by the first to third high resistors, so that both the interstage potentials are stabilized.

The field effect transistor may comprise a first field effect transistor connected between a common terminal and a first terminal and receiving a first control signal in the plurality of gate electrodes, and a second field effect transistor connected between a common terminal and a second terminal and receiving a second control signal which changes so as to be complementary to a first control signal in the plurality of gate electrodes.

In this case, when the first field effect transistor is turned on by the first control signal, the second field effect transistor is turned off by the second control signal. When the first field effect transistor is turned off by the first control signal, the second field effect transistor is turned on by the second control signal. It is possible to use as a switching circuit the first and second field effect transistors in which the interstage potential between the adjacent gate electrodes out of the plurality of gate electrodes is stabilized, and to carry out on-off control between the common terminal and each of the first and second terminals in a stable manner.

The switching circuit device may comprise a bias circuit for applying a bias voltage higher than a voltage of the common terminal to the first terminal and the second terminal, the bias circuit may apply the bias voltage to at least one of the first terminal and the low resistor in the first field effect transistor, and apply the bias voltage to at least one of the second terminal and the low resistor in the second field effect transistor.

In this case, the bias voltage higher than the voltage of the common terminal is applied to the first or second terminal connected to at least the first or second field effect transistor which is in an off state by the bias circuit. Consequently, power handling is improved, and a linear area of input-output characteristics is enlarged. The handling power is prevented from being reduced by reducing a power supply voltage. Consequently, the switching circuit device can be increased in output power in a low-voltage operation and miniaturized.

The high resistor may be connected to a terminal for bias voltage application. In this case, a desired bias voltage can be applied between the gate electrodes by the terminal for bias voltage application.

The field effect transistor may comprise a plurality of field effect transistors, and the plurality of field effect transistors may be connected in parallel. In this case, it is possible to increase an amount of current whose on-off control can be carried out by the switching circuit device.

A semiconductor device according to another aspect of the present invention comprises a semiconductor substrate, a first ohmic electrode formed on the semiconductor substrate, a second ohmic electrode formed on the semiconductor substrate, a first ion implantation area formed in the semiconductor substrate below the first ohmic electrode, a second ion implantation area formed in the semiconductor substrate below the second ohmic electrode, an active layer formed in the semiconductor substrate between the first ion implantation area and the second ion implantation area, a plurality of gate electrodes formed on the active layer, a low resistance area formed in the semiconductor substrate between the adjacent gate electrodes out of the plurality of gate electrodes, and a high resistance area formed in the semiconductor substrate beside the active layer and having a resistance value larger than the resistance value of the low resistance area for changing an interstage potential between the adjacent gate electrodes into a predetermined potential through the low resistance area.

In this case, it is possible to form in a small area the switching circuit device in which the interstage potential between the adjacent gate electrodes out of the plurality of gate electrodes is changed into a predetermined potential by the high resistance area.

The plurality of gate electrodes may comprise a first gate electrode and a second gate electrode adjacent to the first gate electrode, the low resistance area may be formed between the first gate electrode and the second gate electrode, and the high resistance area may connect the low resistance area to one of the first ion implantation area and the second ion implantation area.

In this case, it is possible to configure the switching circuit device in which the interstage potential between the first gate electrode and the second gate electrode is equal to a potential at one of the first ohmic electrode and the second ohmic electrode by the high resistance area.

The plurality of gate electrodes may comprise a first gate electrode and a second gate electrode adjacent to the first gate electrode, the high resistance area may comprise a first high resistance area and a second high resistance area, the low resistance area may be formed between the first gate electrode and the second gate electrode, the first high resistance area may connect the low resistance area and the first ion implantation area, and the second high resistance area may connect the low resistance area and the second ion implantation area.

In this case, it is possible to configure the switching circuit device in which the interstage potential between the first gate electrode and the second gate electrode is equal to the potential at the first ohmic electrode and the potential at the second ohmic electrode by the first and second high resistance areas.

The plurality of gate electrodes may comprise a first gate electrode, a second gate electrode adjacent to the first gate electrode, and a third gate electrode adjacent to the second gate electrode, the low resistance area may comprise a first low resistance area and a second low resistance area, the first low resistance area may be formed between the first gate electrode and the second gate electrode, the second low resistance area may be formed between the second gate electrode and the third gate electrode, and the high resistance area may connect the first low resistance area and the second low resistance area.

In this case, it is possible to configure the switching circuit device in which the interstage potential between the first gate electrode and the second gate electrode and the interstage potential between the second gate electrode and the third gate electrode are equal to each other by the high resistance area.

The plurality of gate electrodes may comprise a first gate electrode, a second gate electrode adjacent to the first gate electrode, and a third gate electrode adjacent to the second gate electrode, the low resistance area may comprise a first low resistance area and a second low resistance area, the high resistance area may comprise a first high resistance area and a second high resistance area, the first low resistance area may be formed between the first gate electrode and the second gate electrode, the second low resistance area may be formed between the second gate electrode and the third gate electrode, the first high resistance area may connect the first low resistance area and the first ion implantation area, and the second high resistance area may connect the second low resistance area and the second ion implantation area.

In this case, it is possible to configure the switching circuit device in which the interstage potential between the first gate electrode and the second gate electrode is equal to the potential at the first ohmic electrode by the first high resistance area, and the interstage potential between the second gate electrode and the third gate electrode is equal to the potential at the second ohmic electrode by the second high resistance area.

The plurality of gate electrodes may comprise a first gate electrode, a second gate electrode adjacent to the first gate electrode, and a third gate electrode adjacent to the second gate electrode, the low resistance area may comprise a first low resistance area and a second low resistance area, the high resistance area may comprise a first high resistance area, a second high resistance area, and a third high resistance area, the first low resistance area may be formed between the first gate electrode and the second gate electrode, the second low resistance area may be formed between the second gate electrode and the third gate electrode, the first high resistance area may connect the first low resistance area and the first ion implantation area, the second high resistance area may connect the second low resistance area and the second ion implantation area, and the third high resistance area may connect the first low resistance area and the second low resistance area.

In this case, it is possible to configure the switching circuit device in which the interstage potential between the first gate electrode and the second gate electrode and the interstage potential between the second gate electrode and the third gate electrode are equal to the potential at the first ohmic electrode and the potential at the second ohmic electrode by the first to third high resistance areas.

The high resistance area may comprise a plurality of high resistance areas formed between the first and second ohmic electrodes, and one of the adjacent high resistance areas out of the plurality of high resistance areas may be formed on one side of the active layer, and the other high resistance area is formed on the other side of the active layer.

In this case, the high resistance areas are respectively connected to both ends of the low resistance area, thereby making it possible to decrease the width of the one low resistance area and to decrease the distance between the first and second ohmic electrodes.

The semiconductor device may further comprise a plurality of voltage application portions for respectively applying voltages to the plurality of gate electrodes, one of the adjacent voltage application portions out of the plurality of voltage application portions may be formed on one side of the active layer between the high resistance areas, and the other voltage application portion may be formed on the other side of the active layer between the high resistance areas.

In this case, it is possible to arrange the voltage application portion between the high resistance areas. Therefore, it is possible to efficiently use the semiconductor substrate, and to further miniaturize the switching circuit device.

The low resistance area may be formed using ion implantation. In this case, it is possible to reduce the low resistance area.

The high resistance area may be formed using ion implantation. In this case, it is possible to reduce the high resistance area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram showing the configuration of a switching circuit device according to a fourth embodiment of the present invention;

DESCRIPTION OF THE PREFERRED EMBODIMENTS

Figure 1:
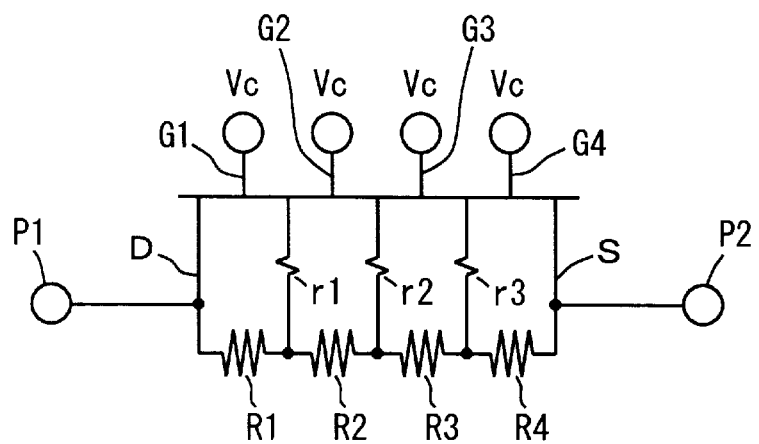
FIG. 1 is a circuit diagram showing the configuration of a switching circuit device according to a first embodiment of the present invention.
Figure 2:
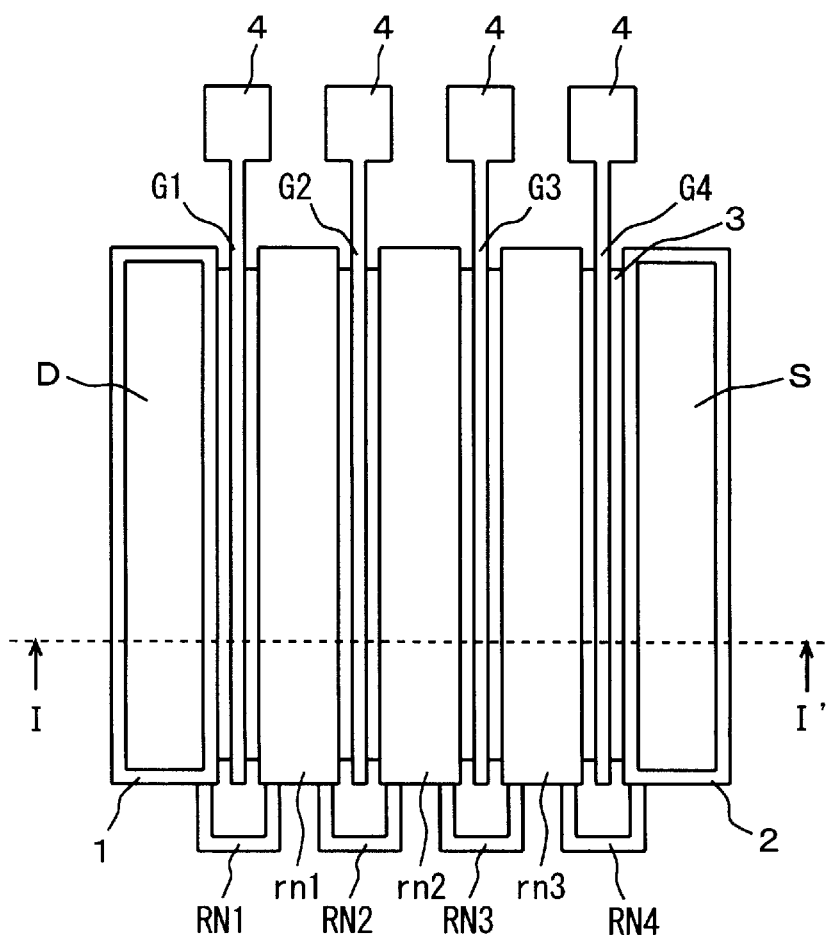
FIG. 2 is a diagram showing a plane pattern of a semiconductor device constituting the switching circuit device shown in FIG. 1.
Figure 3:
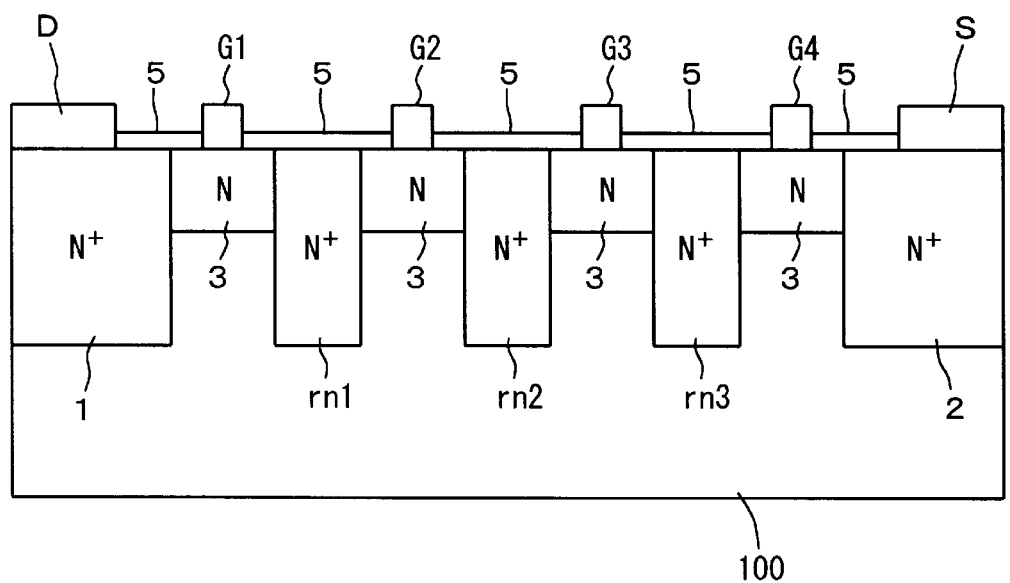
FIG. 3 is a cross-sectional view of a principal part of the semiconductor device constituting the switching circuit device shown in FIG. 1.

FIG. 1 is a circuit diagram showing the configuration of a switching circuit device according to a first embodiment of the present invention, FIG. 2 is a diagram showing a plane pattern of a semiconductor device constituting the switching circuit device shown in FIG. 1, and FIG. 3 is a cross-sectional view taken along a line I–I' of the semiconductor device shown in FIG. 2.

The switching circuit device shown in FIGS. 1 and 2 is constituted by a multi-gate FET having four gate electrodes connected between an input terminal P1 and an output terminal P2. The multi-gate FET comprises first to fourth gate electrodes G1 to G4 in this order from a drain electrode (a first ohmic electrode) D to a source electrode (a second ohmic electrode) S. The switching circuit device is subjected to on-off control by a control voltage Vc applied to each of the gate electrodes G1 to G4.

First to fourth high resistors R1 to R4 are connected in series in this order from the drain electrode D between the drain electrode D and the source electrode S. First to third low resistors r1 to r3 are connected in parallel between a line on which the first to fourth gate electrodes G1 to G4 are connected in series and a line on which the first to fourth high resistors R1 to R4 are connected in series.

Specifically, the first low resistor r1 has its one end connected between the first gate electrode G1 and the second gate electrode G2 and having the other end connected between the first high resistor R1 and the second high resistor R2. The second low resistor r2 has its one end connected between the second gate electrode G2 and the third gate electrode G3 and having the other end connected between the second high resistor R2 and the third high resistor R3. The third low resistor r3 has its one end connected between the third gate electrode G3 and the fourth gate electrode G4 and having the other end connected between the third high resistor R3 and the fourth high resistor R4.

That is, the one end of the first low resistor r1 is connected between the first gate electrode G1 and the second gate electrode G2. The first high resistor R1 is connected between the other end of the first low resistor r1 and the drain electrode D, and the second to fourth high resistors R2 to R4 are connected between the other end of the first low resistor r1 and the source electrode S.

The one end of the second low resistor r2 is connected between the second gate electrode G2 and the third gate electrode G3. The first and second high resistors R1 and R2 are connected between the other end of the second low resistor r2 and the drain electrode D, and the third and fourth high resistors R3 and R4 are connected between the other end of the second low resistor r2 and the source electrode S.

The one end of the third low resistor r3 is connected between the third gate electrode G3 and the fourth gate electrode G4. The first to third high resistors R1 to R3 are connected between the other end of the third low resistor r3 and the drain electrode D, and the fourth high resistor R4 is connected between the other end of the third low resistor r3 and the source electrode S.

The other end of the first low resistor r1 and the other end of the second low resistor r2 are connected to each other through the second high resistor R2, and the other end of the second low resistor r2 and the other end of the third low resistor r3 are connected to each other through the third high resistor R3.

In the first embodiment, the resistance value of each of the first to fourth high resistors R1 to R4 is set so as to satisfy the condition of $R \geq 1/(2\pi \cdot f \cdot C_{off})$, preferably the condition of $R >> 1/(2\pi \cdot f \cdot C_{off})$, letting $C_{off}$ be the off-state capacitance of the FET and f be the frequency of an input-output signal. That is, a multi-gate FET having first to fourth gate electrodes G1 to G4 which are 200 μm in width and having an off-state capacitance $C_{off}$ of 0.06 pF is used herein. In this case, $1/(2\pi \cdot f \cdot C_{off}) = 3$ kΩ at a frequency of 0.9 GHz. Therefore, the resistance value R of each of the first to fourth high resistors R1 to R4 is set to 30 kΩ, which is approximately ten times grater than 3 KΩ. The resistance value r of each of the first to third low resistors r1 to r3 is set to 0.2 to 0.3 Ω.

In a semiconductor device constituting the switching circuit device according to the first embodiment, a first ion implantation layer 1 is formed in a semiconductor substrate 100 below the drain electrode D formed on the semiconductor substrate 100, and a second ion implantation layer 2 is formed in the semiconductor substrate 100 below the source electrode S formed on the semiconductor substrate 100. An active layer 3 functioning as a channel layer is formed in the semiconductor substrate 100 between the first and second ion implantation layers 1 and 2. First to fourth gate electrodes G1 to G4 are formed in this order from the drain electrode D above the active layer 3 on the semiconductor substrate 100. A first low resistance area rn1 is formed in the semiconductor substrate 100 between the first gate electrode G1 and the second gate electrode G2. A second low resistance area rn2 is formed in the semiconductor substrate 100 between the second gate electrode G2 and the third gate electrode G3. A third low resistance area rn3 is formed in the semiconductor substrate 100 between the third gate electrode G3 and the fourth gate electrode G4.

First to fourth high resistance areas RN1 to RN4 are formed in the semiconductor substrate 100 on one side surface of the active layer 3 (below the active layer 3 in FIG. 2). The first high resistance area RN1 connects the first ion implantation layer 1 and the first low resistance area rn1. The second high resistance area RN2 connects the first low resistance area rn1 and the second low resistance area rn2. The third high resistance area RN3 connects the second low resistance area rn2 and the third low resistance area rn3. The fourth high resistance area RN4 connects the third low resistance area rn3 and the second ion implantation area 2.

Wide voltage application portions 4 of the first to fourth gate electrodes G1 to G4 are respectively formed on the other side of the active layer 3 (above the active layer 3 in FIG. 2).

First to third low resistance areas rn1 to rn3 respectively correspond to the first to third low resistors r1 to r3 in the circuit diagram shown in FIG. 1, and the first to fourth high resistance areas RN1 to RN4 respectively correspond to the first to fourth high resistors R1 to R4 in the circuit diagram shown in FIG. 1.

In the semiconductor device constituting the switching circuit device, Si ions are implanted into a predetermined area on a semi-insulating GaAs substrate at an energy of 40 keV, to form the active layer 3. Thereafter, Si ions are implanted into the predetermined area at an energy of 100 keV, to form first to fourth high resistance areas RN1 to RN4. Si ions are implanted into a predetermined area of the active layer 3 at an energy of 150 keV, to simultaneously form the first and second ion implantation layers 1 and 2 and the first to third low resistance areas rn1 to rn3.

The doping concentration of the Si ions in the active layer 3 is $2 \times 10^{17}$ cm$^{-2}$, and the active layer 3 is formed to a depth of approximately 80 nm from the surface of the semiconductor substrate. The doping concentration of the Si ions in the first to fourth high resistance areas RN1 to RN4 is $1 \times 10^{17}$ cm$^{-2}$, and each of the high resistance areas RN1 and RN4 is formed to a depth of approximately 200 nm from the surface of the semiconductor substrate. The doping concentration of the Si ions in the first and second ion implantation layers 1 and 2 and the first to third low resistance areas rn1 to rn3 is $5 \times 10^{17}$ cm$^{-2}$, and each of the ion implantation layers 1 and 2 and the low resistance areas rn1 to rn3 is formed to a depth of approximately 300 nm from the surface of the semiconductor substrate. In FIG. 3, a protective film 5 is a protective film, which is 20 nm in thickness, composed of SiN.

The switching circuit device according to the first embodiment is constituted by the multi-gate FET having the four gate electrodes between the drain electrode D and the source electrode S. Therefore, the switching circuit device can be decreased in an area to be used, as compared with a switching circuit device having four FETs in series.

Figure 4:
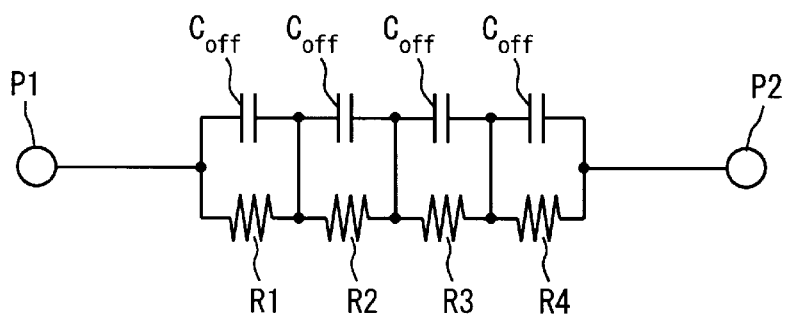
FIG. 4 is a diagram showing an equivalent circuit of the switching circuit device shown in FIG. 1 in a case where it is turned off.

A portion between the gate electrodes G1 to G4 is connected to the drain electrode D and the source electrode S through the first to third low resistors r1 to r3 and the first to fourth high resistors R1 to R4. Therefore, each interstage potential between the gate electrodes G1 to G4 is stabilized upon being equal to a potential at the drain electrode D and a potential at the source electrode S. As a result, the switching circuit device according to the first embodiment can be brought into a completely off state in a case where it is turned off. FIG. 4 is a diagram showing an equivalent circuit of the switching circuit device according to the first embodiment in a case where it is turned off.

Since the first to third low resistance areas rn1 to rn3 and the first to fourth high resistance areas RN1 to RN4 are respectively formed of ion implantation layers, they are small in size. Therefore, the switching circuit device is only slighty increased in area by providing new resistors.

Figure 5:
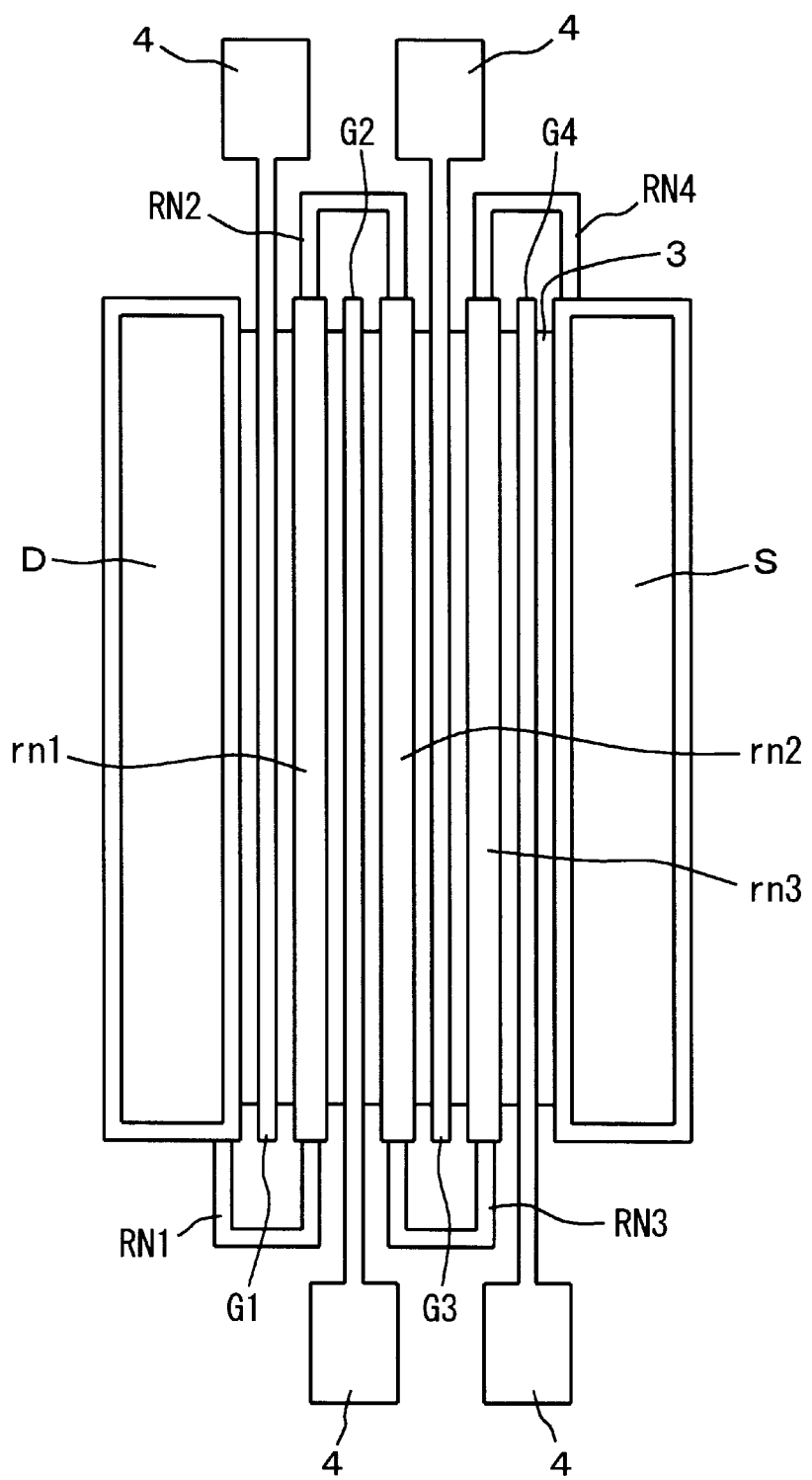
FIG. 5 is a diagram showing a plane pattern of a semiconductor device constituting a switching circuit device according to a second embodiment of the present invention.

FIG. 5 is a diagram showing a plane pattern of a semiconductor device constituting a switching circuit device according to a second embodiment of the present invention, where the same portions as those shown in FIG. 2 are assigned the same reference numerals. The switching circuit device according to the second embodiment is the same in circuit connection as the switching circuit device according to the first embodiment shown in FIG. 1, while differing therefrom in plane pattern in the following respects.

In the semiconductor device constituting the switching circuit device according to the second embodiment, a first high resistance area RN1 and a third high resistance area RN3 are formed on one side of an active layer 3, and a second high resistance area RN2 and a fourth high resistance area RN4 are formed on the other side of the active layer 3. That is, the first to fourth high resistance areas RN1 to RN4 are alternately formed on one side and the other side of the active layer 3.

Respective voltage application portions 4 of second and fourth gate electrodes G2 and G4 are formed on one side of the active layer 3, and respective voltage application portions 4 of first and third gate electrodes G1 and G3 are formed on the other side of the active layer 3. That is, the four voltage application portions 4 are alternately formed on one side and the other side of the active layer 3.

In the switching circuit device according to the second embodiment, a first low resistance area rn1 has its one end connected to the first high resistance area RN1 and has the other end connected to the second high resistance area RN2, so that the width of the first low resistance area rn1 can be decreased. A second low resistance area also has its one end connected to the third high resistance area RN3 and has the other end connected to the second high resistance area RN2, so that the width of the second low resistance area rn2 can be decreased. A third low resistance area rn3 also has its one end connected to the third high resistance area RN3 and has the other end connected to the fourth high resistance area RN4, so that the width of the third low resistance area rn3 can be decreased.

That is, both ends of each of the first to third low resistance areas rn1 to rn3 are utilized for connection to the high resistance areas RN1 to RN4, so that the width of the low resistance area can be decreased. Consequently, the distance between a drain electrode D and a source electrode S can be decreased. The voltage application portions 4 are arranged among the high resistance areas RN1 to RN4, so that a semiconductor substrate can be efficiently used. As a result, this is suited to decrease the area of the switching circuit device.

Figure 6:
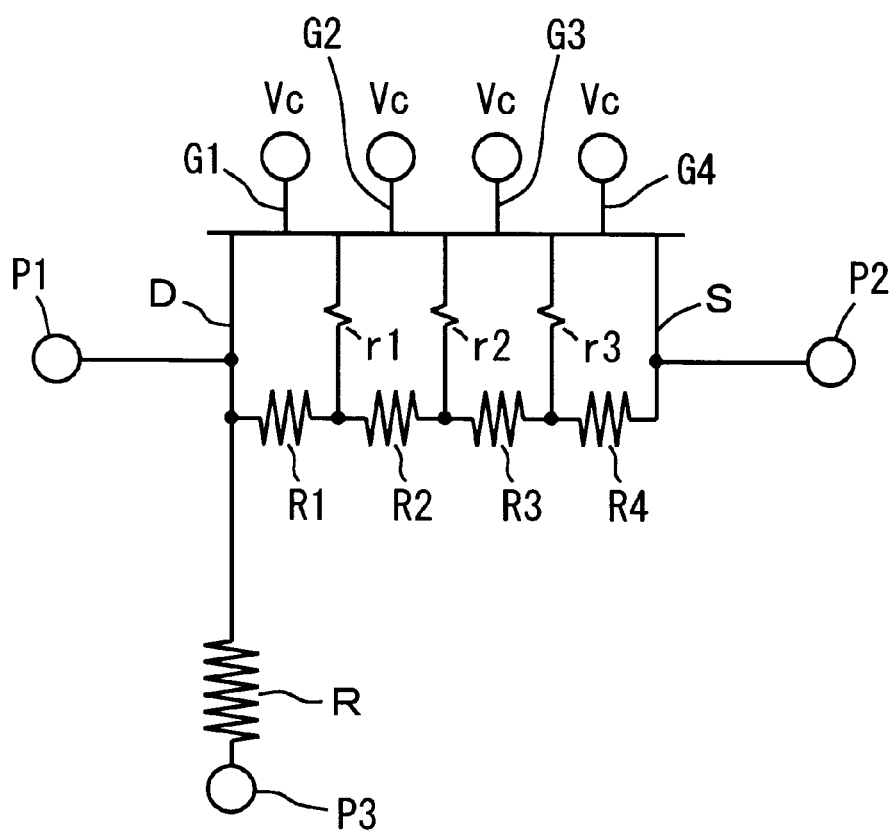
FIG. 6 is a circuit diagram showing the configuration of a switching circuit device according to a third embodiment of the present invention.

FIG. 6 is a circuit diagram showing the configuration of a switching circuit device according to a third embodiment of the present invention which is an improvement of the switching circuit device according to the first embodiment or the second embodiment. In the switching circuit device according to the third embodiment shown in FIG. 6, a bias terminal P3 for applying a bias voltage toward a drain electrode D in a first high resistance area R1 through a resistor R is provided in addition to an input terminal P1. In this case, a desired bias voltage can be applied between a drain electrode D and each of gate electrodes G1 to G4 by the one bias terminal P3.

The bias terminal P3 may be connected through the resistor R between the first high resistor R1 and a second high resistor R2, between the second high resistor R2 and a third high resistor R3, between the third high resistor R3 and a fourth high resistor R4, or between the fourth high resistor R4 and a source electrode S.

Figure 8:
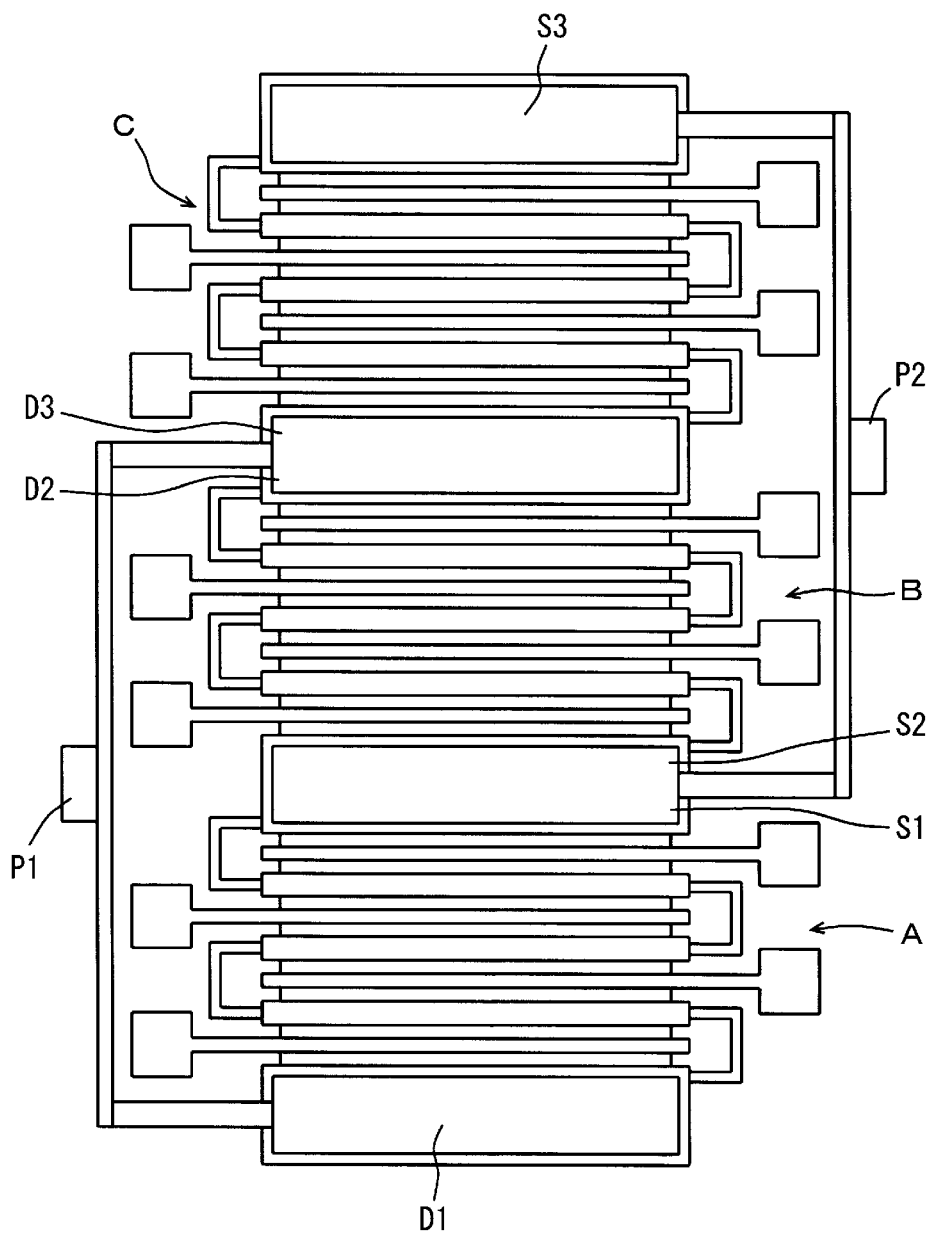
FIG. 8 is a diagram showing a plane pattern of a semiconductor device constituting the switching circuit device shown in FIG. 7.

FIG. 7 is a circuit diagram showing the configuration of a switching circuit device according to a fourth embodiment of the present invention, and FIG. 8 is a diagram showing a plane pattern of a semiconductor device constituting the switching circuit device shown in FIG. 7.

In the switching circuit device according to the fourth embodiment, three first to third switching circuit portions A, B, and C which have the same configuration as that of the switching circuit device according to the second embodiment are connected in parallel between an input terminal P1 and an output terminal P2.

As shown in FIGS. 7 and 8, the switching circuit device comprises the first to third switching circuit portions A, B, and C respectively having drain electrodes D1 to D3 and source electrodes S1 to S3. As shown in FIG. 8, a source electrode S1 of the first switching circuit portion A and a source electrode S2 of the second switching circuit portion B are formed of the common electrode layer, and a drain electrode D2 of the second switching circuit portion B and a drain electrode D3 of the third switching circuit device C are formed of the common electrode layer.

Figure 9:
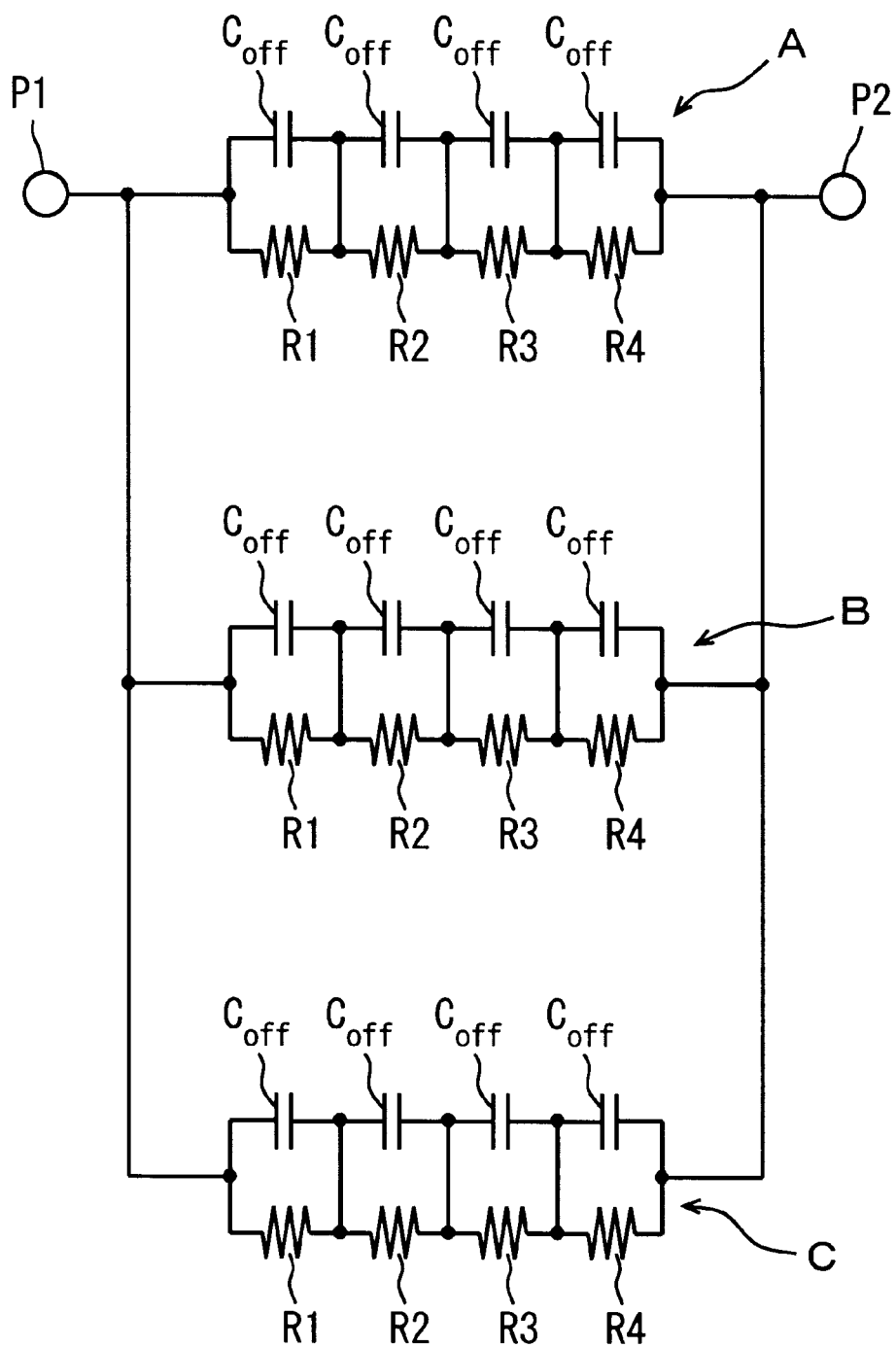
FIG. 9 is a diagram showing an equivalent circuit of the switching circuit device shown in FIG. 7 in a case where it is turned off.

In the switching circuit device according to the fourth embodiment, the first to third switching circuit portions A, B, and C, that is, the three switching circuit portions are connected in parallel, so that an amount of current flowing between the input terminal P1 and the output terminal P2 can be increased. In such a circuit, an interstage potential between gate electrodes in each of the switching circuit portions can be stabilized. Therefore, the switching circuit device can be brought into a completely off state in a case where it is turned off. FIG. 9 is a diagram showing an equivalent circuit of the switching circuit device according to the fourth embodiment in a case where it is turned off.

With respect to a switching circuit device according to the present invention in which 10 switching circuit devices according to the first embodiment are connected in parallel between input and output terminals, and a conventional switching circuit device in which 10 conventional switching circuit devices are connected in parallel therebetween, the input-output characteristics was measured. As a result, a maximum value of a linear output power is 1.6 W (32.1 dBm) in the conventional switching circuit device, while being 2.3 W (33.6 dBm) which is significantly higher in the switching circuit device according to the present invention.

Figure 10:
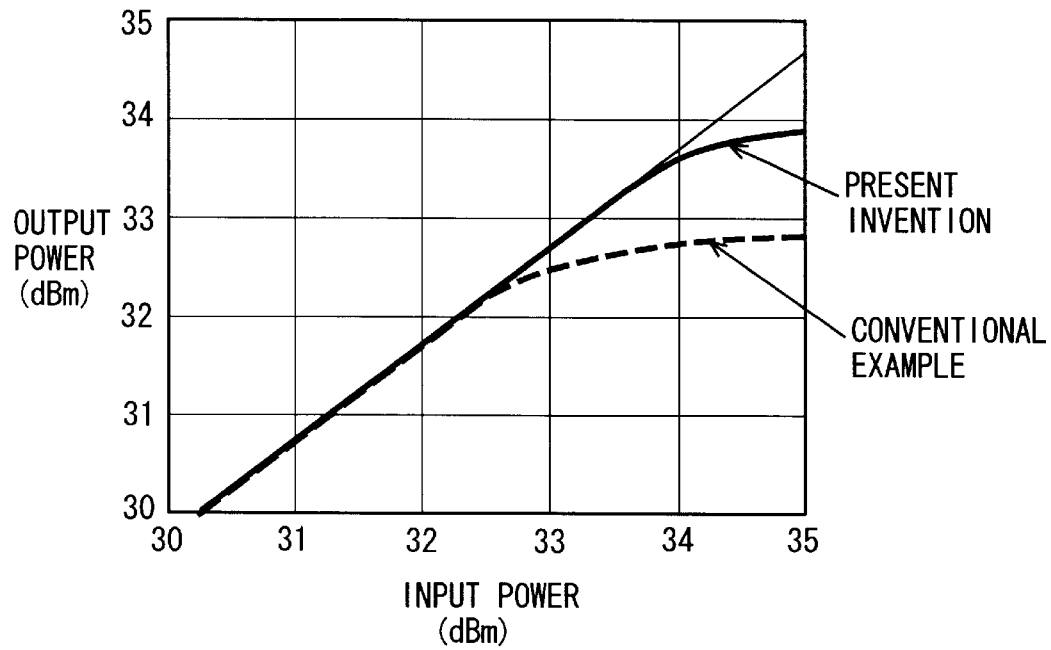
FIG. 10 is a diagram showing the respective input-output characteristics of the switching circuit device according to the present invention and a conventional switching circuit device.

That is, it is found that in the switching circuit device according to the present invention, a leakage power at the terminal with an off state is made smaller, and the maximum value of the linear output power is made higher, as compared with those in the conventional switching circuit device. FIG. 10 is a diagram showing input-output characteristics in the switching circuit device according to the present invention and the conventional switching circuit device.

Figure 11:
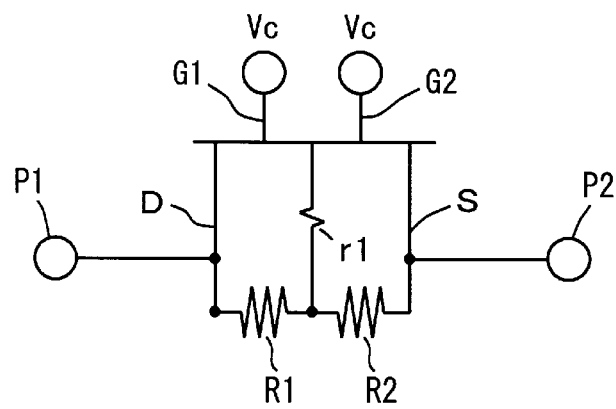
FIG. 11 is a circuit diagram showing the configuration of a switching circuit device according to a fifth embodiment of the present invention.
Figure 12:
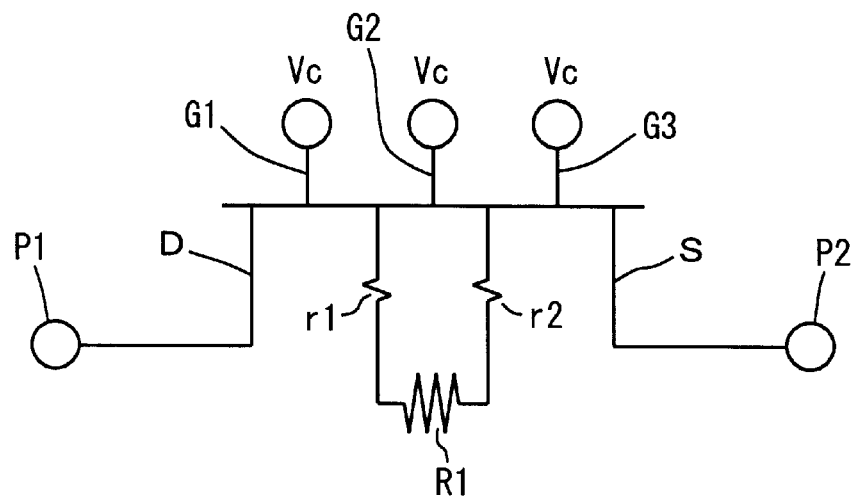
FIG. 12 is a circuit diagram showing the configuration of a switching circuit device according to a sixth embodiment of the present invention.
Figure 13:
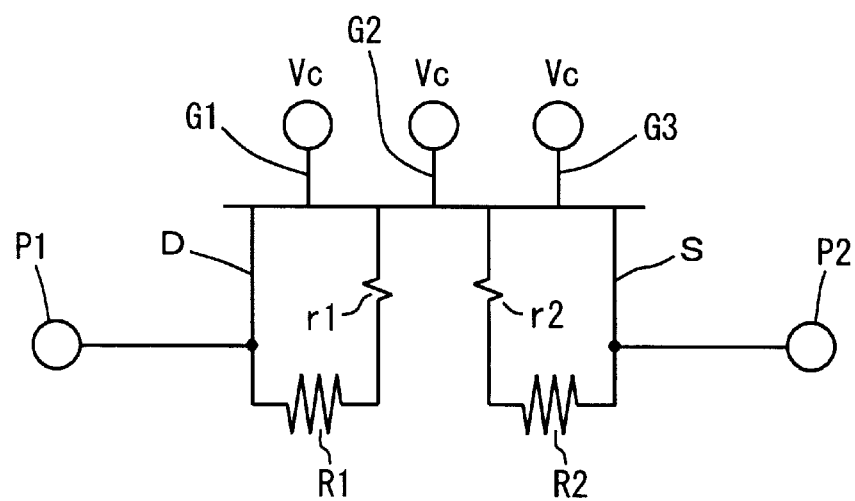
FIG. 13 is a circuit diagram showing the configuration of a switching circuit device according to a seventh embodiment of the present invention.

The present invention is also applicable to a switching circuit device according to a fifth embodiment shown in FIG. 11, a switching circuit device according to a sixth embodiment shown in FIG. 12, and a switching circuit device according to a seventh embodiment shown in FIG. 13.

In the switching circuit device according to the fifth embodiment shown in FIG. 11, a multi-gate FET having first and second gate electrodes G1 and G2 is connected between an input terminal P1 and an output terminal P2. A first low resistor r1 has its one end connected between the first gate electrode G1 and the second gate electrode G2. A first high resistor R1 is connected between the other end of the first low resistor r1 and a drain electrode D, and a second high resistor R2 is connected between the other end of the first low resistor r1 and a source electrode S.

In the switching circuit device according to the fifth embodiment, a portion between the first and second gate electrodes G1 and G2 is connected to the drain electrode D and the source electrode S through the first low resistor r1 and the first and second high resistors R1 and R2. Therefore, an interstage potential between the first and second gate electrodes G1 and G2 is stabilized upon being equal to a potential at the drain electrode D and a potential at the source electrode S, thereby making it possible to restrain a leakage signal in a case where the switching circuit device is turned off. Although in the present embodiment, both the first high resistor R1 and the second high resistor R2 are provided, either one of them may be provided, in which case the above-mentioned leakage signal can be reduced.

In the switching circuit device according to the sixth embodiment shown in FIG. 12, a multi-gate FET having first to third gate electrodes G1 to G3 is connected between an input terminal P1 and an output terminal P2. A first low resistor r1 has its one end connected between the first gate electrode G1 and the second gate electrode G2. A second low resistor r2 has its one end connected between the second gate electrode G2 and the third gate electrode G3. The other end of the first low resistor r1 and the other end of the second low resistor r2 are connected to each other through a first high resistor R1.

In the switching circuit device according to the sixth embodiment, a portion between the first and second gate electrodes G1 and G2 and a portion between the second and third gate electrodes G2 and G3 are connected to each other through the first and second low resistors r1 and r2 and the first high resistor R1. Therefore, an interstage potential between the first and second gate electrodes G1 and G2 and an interstage potential between the second and third gate electrode G2 and G3 are stabilized upon being equal to each other. In this case, it is possible to reduce a leakage signal in a case where the switching circuit device is turned off.

In the switching circuit device according to the seventh embodiment shown in FIG. 13, a multi-gate FET having first to third gate electrodes G1 to G3 is connected between an input terminal P1 and an output terminal P2. A first low resistor r1 has its one end connected between the first gate electrode G1 and the second gate electrode G2. A second low resistor r2 has its one end connected between the second gate electrode G2 and the third gate electrode G3. The other end of the first low resistor r1 and a drain electrode D are connected to each other through a first high resistor R1. The other end of the second low resistor r2 and a source electrode S are connected to each other through a second high resistor R2.

In the switching circuit device according to the seventh embodiment, a portion between the first and second gate electrodes G1 and G2 is connected to the drain electrode D through the first low resistor r1 and the first high resistor R1. Further, a portion between the second and third gate electrodes G2 and G3 is connected to the source electrode S through the second low resistor r2 and the second high resistor R2. Therefore, an interstage potential between the first and second gate electrodes G1 and G2 is stabilized upon being equal to the drain electrode D, and an interstage potential between the second and third gate electrode G2 and G3 is stabilized upon being equal to the source electrode S. Therefore, it is possible to reduce a leakage signal in a case where the switching circuit device is turned off in these portions.

Figure 14:
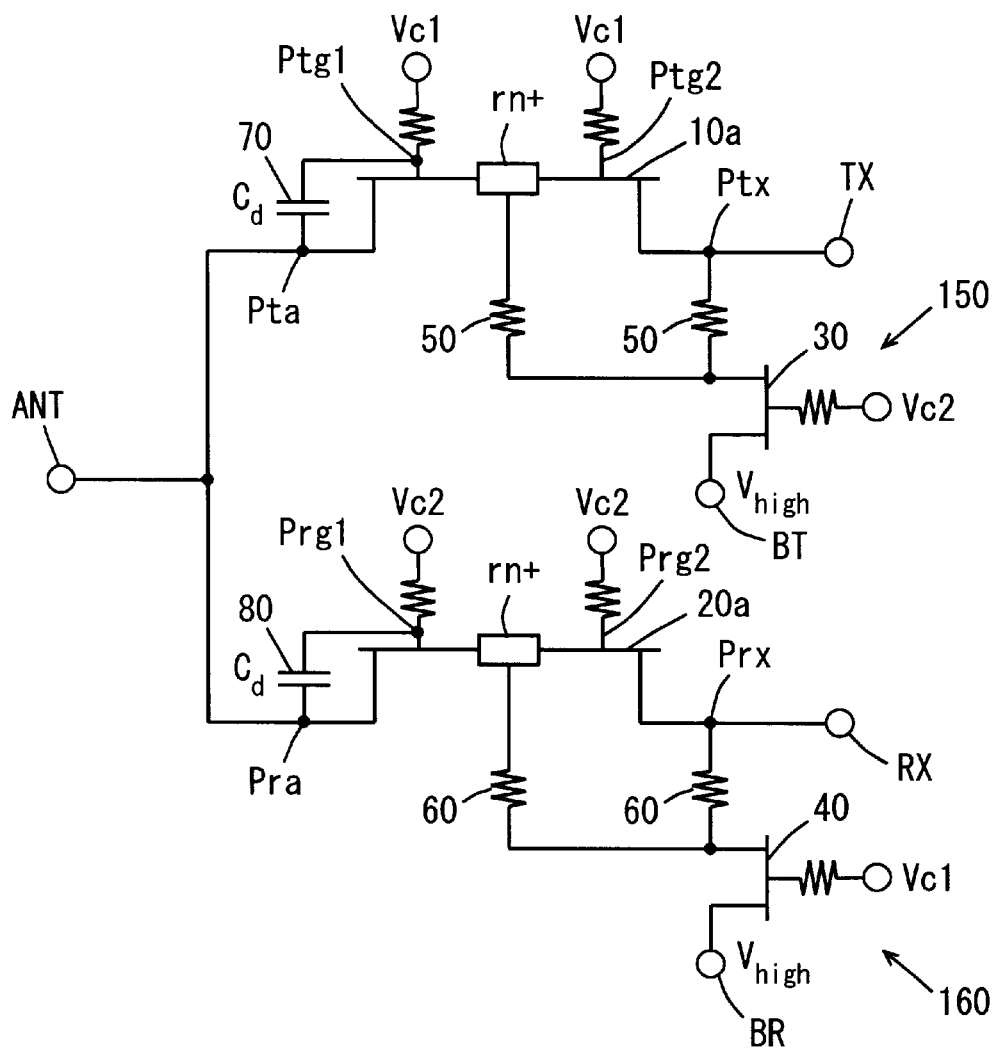
FIG. 14 is a circuit diagram showing the configuration of a switching circuit device according to an eighth embodiment of the present invention.

FIG. 14 is a circuit diagram showing the configuration of a switching circuit device according to an eighth embodiment of the present invention.

In the switching circuit device shown in FIG. 14, dual gate FETs 10a and 20a are used as a multi-gate FET. The dual gate FET 10a having two gate electrodes Ptg1 and Ptg2 is connected between a node Pta and a node Ptx. The dual gate FET 20a having two gate electrodes Prg1 and Prg2 is connected between the node Pra and the node Prx. The dual gate FETs 10a and 20a are thus used, so that the switching circuit device can be miniaturized and increased in output power.

Control signals Vc1 are respectively fed to the gate electrodes Ptg1 and Ptg2 in the FET10a through resistors. Control signals Vc2 are respectively fed to the gate electrodes Prg1 and Prg2 in the FET 20a through resistors. An additional capacitance 70 is connected between the gate electrode Ptg1 and the node Pta in the FET 10a, and an additional capacitance 80 is connected between the gate electrode Prg1 and the node Pra in the FET 20a.

A low resistance area rn+ is provided between the gate electrodes Ptg1 and Ptg2 in the FET 10a. The low resistance area rn+ and the node Ptx are respectively connected to a bias terminal BT through high resistors 50 and a common FET 30. A low resistance area rn+ is provided between the gate electrodes Prg1 and Prg2 in the FET 20a. The low resistance area rn+ and the node Prx are respectively connected to a bias terminal BR through high resistors 60 and a common FET 40. The control signal Vc2 is fed to a gate electrode in the FET 30, and the control signal Vc1 is fed to a gate electrode in the FET 40. High-level voltages $V_{high}$ are respectively fed as bias voltages to the bias terminals BT and BR.

The two high resistors 50 and the FET 30 constitute a bias circuit 150, and the two high resistors 60 and the FET 40 constitute a bias circuit 160.

For example, when the control signal Vc1 has a high-level voltage $V_{high}$, and the control signal Vc2 has a low-level voltage $V_{low}$, the FET 10a is turned on, and the FET 20a is turned off. Simultaneously, the FET 30 is turned off, and the FET 40 is turned on. Consequently, the high-level voltage $V_{high}$ is applied to the low resistance area rn+ and the node Prx by the bias circuit 160.

When the control signal Vc1 has a low-level voltage $V_{low}$, and the control signal Vc2 has a high-level voltage $V_{high}$, the FET 10a is turned off, and the FET 20a is turned on. Simultaneously, the FET 30 is turned on, and the FET 40 is turned off. Consequently, the high-level voltage $V_{high}$ is applied to the FET 20a and the node Ptx by the bias circuit 150.

Figure 15:
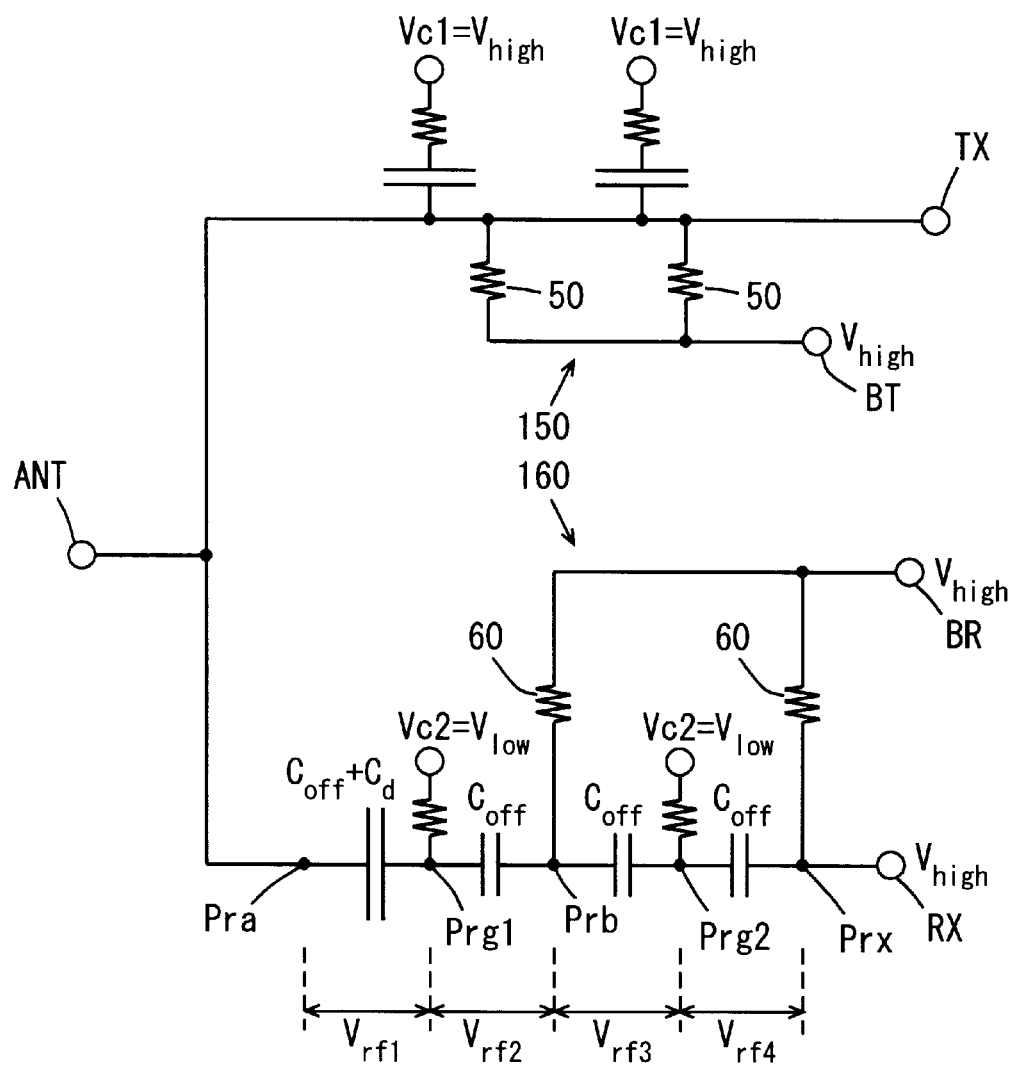
FIG. 15 is a diagram showing an equivalent circuit of the switching circuit device shown in FIG. 14.

FIG. 15 is a diagram showing an equivalent circuit of the switching circuit device shown in FIG. 14. In the equivalent circuit diagram of FIG. 15, a case where a FET 10a is turned on and a FET 20a is turned off is illustrated. That is, the control signal Vc1 has a high-level voltage $V_{high}$, and the control signal Vc2 has a low-level voltage $V_{low}$. The low resistance area rn+ shown in FIG. 14 is omitted, and a low resistance area rn+ of the FET 20a is indicated by a node Prb.

In this case, the condition that an off state between a node Pra and a gate electrode Prg1 is maintained is given by the following equation:

$$V_{high} - V_{low} + V_p - V_{bi} \geq V_{rf1} \quad (B1)$$

$V_{rf1}$ is the amplitude ($\geq 0$) of a signal applied between the node Pra and the gate electrode Prg1, $V_p$ is a pinch-off voltage of the FETs 10a and 20a and $V_{bi}$ is a built-in voltage of the FETs 10a and 20a. Further, the condition that an off state between the gate electrode Prg1 and the node Prb is maintained is given by the following equation:

$$V_{high} - V_{low} + V_p \geq V_{rf2} \quad (B2)$$

$V_{rf2}$ is the amplitude ($\geq 0$) of a signal applied between the gate electrode Prg1 and the node Prb. Further, the condition that an off state between the node Prb and the gate electrode Prg2 is maintained is given by the following equation:

$$V_{high} - V_{low} + V_p \geq V_{rf3} \quad (B3)$$

$V_{rf3}$ is the amplitude ($\geq 0$) of a signal applied between the node Prb and a gate electrode Prg2. Further, the condition that an off state between the gate electrode Prg2 and a node Prx is maintained is given by the following equation:

$$V_{high} - V_{low} + V_p \geq V_{rf4} \quad (B4)$$

$V_{rf4}$ is the amplitude ($\geq 0$) of a signal applied between the gate electrode Prg2 and the node Prx.

The maximum allowable signal amplitude between the node Pra and the gate electrode Prg1 is denoted by $V_{rf1m}$, the maximum allowable signal amplitude between the gate electrode Prg1 and the node Prb is denoted by $V_{rf2m}$, the maximum allowable signal amplitude between the node Prb and the gate electrode Prg2 is denoted by $V_{rf3m}$, and the maximum allowable signal amplitude between the gate electrode Prg2 and the node Prx is denoted by Vrf$_4$m, the foregoing equations (B1), (B2), (B3), and (B4) are replaced with the following equations:

$$V_{rf1m} = V_{high} - V_{low} + V_P - V_{bi} = V_h - V_{bi} \quad (B5)$$

$$V_{rf2m} = V_{high} - V_{low} + V_P = V_h \quad (B6)$$

$$V_{rf3m} = V_{high} - V_{low} + V_P = V_h \quad (B7)$$

$$V_{rf4m} = V_{high} - V_{low} + V_P = V_h \quad (B8)$$

A voltage distribution by capacitances is expressed by the following equation:

$$(C_{off} + C_d) \cdot V_{rf1m} = C_{off} V_{rf2m} = C_{off} V_{rf3m} = C_{off} V_{rf4m} \quad (B9)$$

In order to simultaneously realize the maximum allowable signal amplitudes $V_{rf1m}$, $V_{rf2m}$, $V_{rf3m}$, and $V_{rf4m}$, the following condition must be satisfied by the foregoing equations (B5) to (B9):

$$C_d = C_{off} V_{bi} / (V_h - V_{bi}) \quad (B10)$$

At this time, the maximum allowable signal amplitude $V_{rfm}$ between the node Pra and the node Prx is expressed by the following equation:

$$V_{rfm} = V_{rf1m} + V_{rf2m} + V_{rf3m} + V_{rf4m} \quad (B11)$$

Furthermore, the foregoing equation (B11) is expressed by the following equation from the foregoing equations (B5) to (B8):

$$V_{rfm} = 4V_h - V_{bi} \quad (B12)$$

It is assumed that the terminal TX is connected to a power source having an interval resistance of a resistance value R and the terminal ANX is connected to a load resistor of a resistance value R. At this time, handling power $P_h$ is expressed by the following equation:

$$P_h = (V_{rfm})^2 / (2R) = (2V_h - V_{bi})^2 / (2R) \quad (B13)$$

If the foregoing equation (B13) is further generalized, the power handling $P_h$ in a case where the number of stages of connected FETs is n is expressed by the following equation:

$$P_h = (2nV_h - V_{bi})^2 / (2R) \quad (B14)$$

The handling power $P_h$ of the conventional switching circuit device is expressed by the following equation, as described above:

$$P_h = (2n)^2 \cdot (V_h - V_{bi})^2 / (2R) \quad (C4)$$

From the foregoing equations (B14) and (C4), a difference $\Delta P_h$ in the power handling between the switching circuit device according to the present embodiment and the conventional switching circuit device is expressed by the following equation:

$$\Delta P_h = \{4nV_h - (2n+1)V_{bi}\}\{(2n-1)V_{bi}\}/(2R) \quad (B15)$$

It is assumed that $V_{high} = 3$ [V], $V_{low} = 0$, $V_p = -1$ [V], n=2, R=50 [Ω], $C_d = 0.2$ [pF], and $C_{off} = 0.6$ [pF]. When Pt is used as a gate metal of the FETs 10a and 20a, $V_{bi}$ is approximately 0.5 [V].

In this case, the power handling $P_h$ in the conventional switching circuit device is 360 mW from the equation (C4). On the other hand, the power handling $P_h$ is approximately 560 mW from the equation (B14). As a result, a linear area of an output signal of the switching circuit device is enlarged.

It is assumed that $V_{high}=2$ [V], $V_{low}=0$, $V_p=-1$ [V], $V_{bi}=0.5$ [V], n=2, R=50 [Ω], $C_d=0.2$ [pF], $C_{off}=0.6$ [pF].

In this case, the power handling $P_h$ in the conventional switching circuit device is 40 mW from the equation (C4). On the other hand, the power handling $P_h$ in the switching circuit device according to the present embodiment is 122.5 mW from the equation (B14). In the switching circuit device according to the present embodiment, power handling which is not less than three times that in the conventional switching circuit device is obtained. As a result, the power handling can be prevented from being reduced even if the control signals Vc1 and Vc2 respectively have low voltages.

The switching circuit device according to the present embodiment can be increased in output power even in a case where an FET having a large built-in voltage $V_{bi}$ is used.

Figure 16:
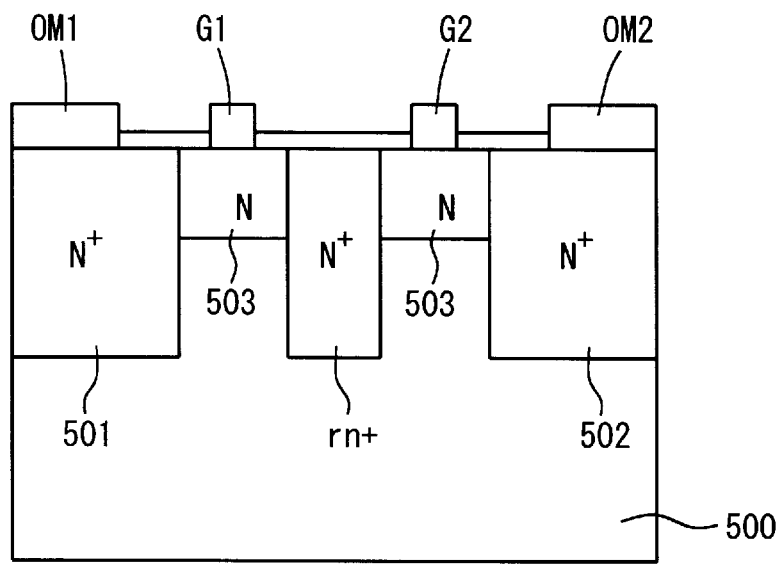
FIG. 16 is a cross-sectional view of a principal part of a semiconductor device constituting the switching circuit device shown in FIG. 14.
Figure 17:
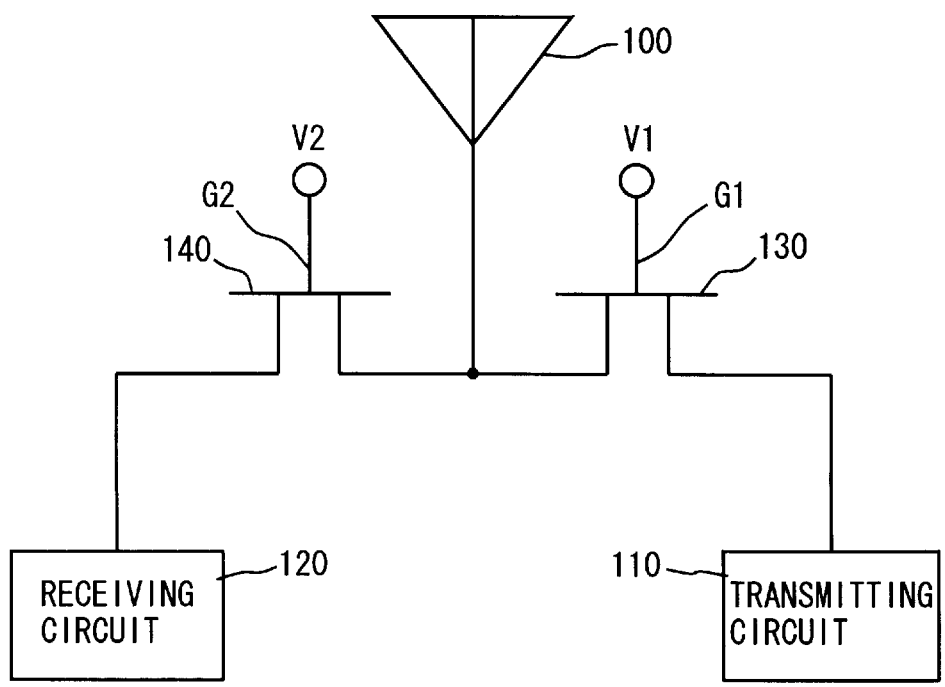
FIG. 17 is a diagram showing the configuration of a transmitter-receiver using the conventional switching circuit device.
Figure 18:
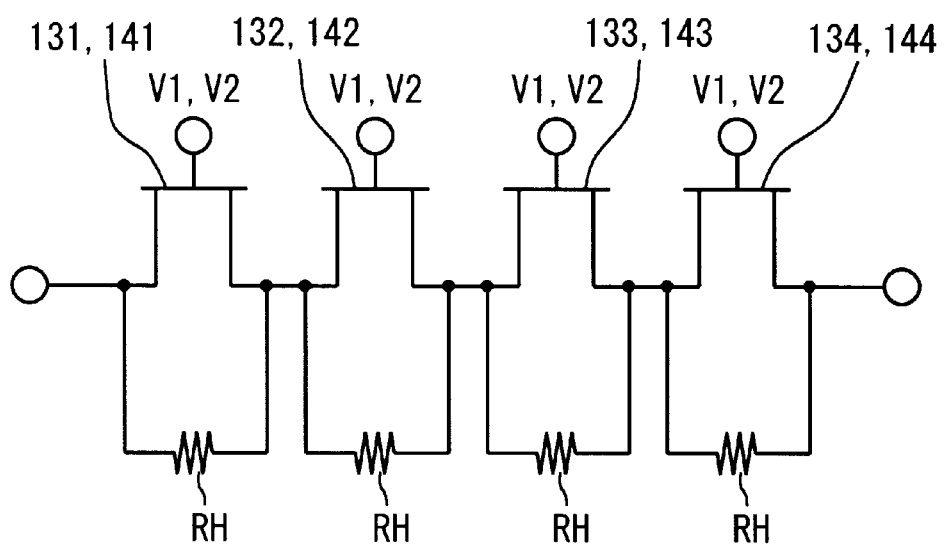
FIG. 18 is a circuit diagram showing the configuration of the switching circuit device shown in FIG. 17.

FIG. 16 is a schematic sectional view of a dual gate FET used in the switching circuit device shown in FIG. 14.

As shown in FIG. 16, a pair of N+ ion implantation layers 501 and 502 is formed a predetermined distance away from each other in a substrate 500 composed of GaAs. Ohmic electrodes OM1 and OM2 are respectively formed on the N+ ion implantation layers 501 and 502. N-type active layers 503 are formed in the substrate 500 between the pair of N+ ion implantation layers 501 and 502.

Two gate electrodes G1 and G2 are found a predetermined distance away from each other on the active layer 503 between the ohmic electrodes OM1 and OM2. A low resistance area rn+ composed of an N+ ion implantation layer is formed in the substrate 500 between the gate electrodes G1 and G2.

The gate electrodes G1 and G2 respectively correspond to the gate electrodes Ptg1 and Ptg2 in the FET 10a shown in FIG. 14 and the gate electrodes Prg1 and Prg2 in the FET 20a. The ohmic electrodes OM1 and OM2 respectively correspond to the nodes Pta and Ptx in the FET 10a shown in FIG. 14 and the nodes Pra and Prx in the FET 20a shown in FIG. 14.

Particularly in the switching circuit device according to the present embodiment, the low resistance area rn+ and the high resistors 50 and 60 are formed by an ion implantation process in which they are easy to fine. Accordingly, the switching circuit device can be miniaturized. In the switching circuit device according to the present embodiment, therefore, the power handling $P_h$ is improved, and the miniaturization is possible.

Although in each of the above-mentioned embodiments, description was made of the multi-gate FET having two to four gate electrodes, the present invention is also applicable to an FET having gate electrodes whose number is not less than 2 to 4, and a FET in which a first ohmmic electrode is a source electrode and a second ohmic electrode is a drain electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A switching circuit device comprising a multi-gate field effect transistor, wherein
said field effect transistor comprises:
a first ohmic electrode;
a second ohmic electrode;
a plurality of gate electrodes;
a low resistor having its one end connected between the adjacent gate electrodes out of said plurality of gate electrodes; and
a high resistor coupled to said low resistor having a resistance value larger than the resistance value of said low resistor for changing an interstage potential between said adjacent gate electrodes into a predetermined potential through said low resistor.

2. The switching circuit device according to claim 1, wherein
said plurality of gate electrodes comprise a first gate electrode and a second gate electrode adjacent to said first gate electrode,
the one end of said low resistor is connected between said first gate electrode and said second gate electrode, and
said high resistor is connected between the other end of said low resistor and one of said first ohmic electrode and said second ohmic electrode.

3. The switching circuit device according to claim 1, wherein
said plurality of gate electrodes comprise a first gate electrode and a second gate electrode adjacent to said first gate electrode,
said high resistor comprises a first high resistor and a second high resistor,
the one end of said low resistor is connected between said first gate electrode and said second gate electrode,
said first high resistor is connected between the other end of said low resistor and said first ohmic electrode, and
said second high resistor is connected between the other end of said low resistor and said second ohmic electrode.

4. The switching circuit device according to claim 1, wherein
said plurality of gate electrodes comprise a first gate electrode, a second gate electrode adjacent to said first gate electrode, and a third gate electrode adjacent to said second gate electrode,
said low resistor comprises a first low resistor and a second low resistor,
said first low resistor has its one end connected between said first gate electrode and said second gate electrode,
said second low resistor has its one end connected between said second gate electrode and said third gate electrode, and
said high resistor is connected between the other end of said first low resistor and the other end of said second low resistor.

5. The switching circuit device according to claim 1, wherein
said plurality of gate electrodes comprise a first gate electrode, a second gate electrode adjacent to said first gate electrode, and a third gate electrode adjacent to said second gate electrode,
said low resistor comprises a first low resistor and a second low resistor, said high resistor comprises a first high resistor and a second high resistor, said first low resistor has its one end connected between said first gate electrode and said second gate electrode, said second low resistor has its one end connected between said second gate electrode and said third gate electrode, said first high resistor is connected between the other end of said first low resistor and said first ohmic electrode, and said second high resistor is connected between the other end of said second low resistor and said second ohmic electrode.

6. The switching circuit device according to claim 1, wherein said plurality of gate electrodes comprise a first gate electrode, a second gate electrode adjacent to said first gate electrode, and a third gate electrode adjacent to said second gate electrode, said low resistor comprises a first low resistor and a second low resistor, said high resistor comprises a first high resistor, a second high resistor, and a third high resistor, said first low resister has its one end connected between said first gate electrode and said second gate electrode, said second low resistor has its one end connected between said second gate electrode and said third gate electrode, said first high resistor is connected between the other end of said first low resistor and said first ohmic electrode, said second high resistor is connected between the other end of said second low resistor and said second ohmic electrode, and said third high resistor is connected between the other end of said first low resistor and the other end of said second low resistor.

7. The switching circuit device according to claim 1, wherein said field effect transistor comprises:
    a first field effect transistor connected between a common terminal and a first terminal and receiving a first control signal in the plurality of gate electrodes; and
    a second field effect transistor connected between said common terminal and a second terminal and receiving a second control signal which changes so as to be complementary to said first control signal in the plurality of gate electrodes.

8. The switching circuit device according to claim 7, further comprising:

a bias circuit for applying a bias voltage higher than a voltage of said common terminal to said first terminal and said second terminal, said bias circuit applying said bias voltage to at least one of said first terminal and the low resistor in said first field effect transistor, and applying said bias voltage to at least one of said second terminal and the low resistor in said second field effect transistor.

9. The switching circuit device according to claim 1, wherein said high resistor is connected to a terminal for bias voltage application.

10. The switching circuit device according to claim 1, wherein said field effect transistor comprises a plurality of field effect transistors, and said plurality of field effect transistors are connected in parallel.

11. A semiconductor device comprises:

a semiconductor substrate;

a first ohmic electrode formed on said semiconductor substrate;

a second ohmic electrode formed on said semiconductor substrate;

a first ion implantation area formed in said semiconductor substrate below said first ohmic electrode;

a second ion implantation area formed in said semiconductor substrate below said second ohmic electrode;

an active layer formed in said semiconductor substrate between said first ion implantation area and said second ion implantation area;

a plurality of gate electrodes formed on said active layer;

a low resistance area formed in said semiconductor substrate between the adjacent gate electrodes out of said plurality of gate electrodes; and a high resistance area formed in said semiconductor substrate beside said active layer and having a resistance value larger than the resistance value of said low resistance area for changing an interstage potential between said adjacent gate electrodes into a predetermined potential through said low resistance area.

12. The semiconductor device according to claim 11, wherein said plurality of gate electrodes comprise a first gate electrode and a second gate electrode adjacent to the first gate electrode, said low resistance area is formed between said first gate electrode and said second gate electrode, and said high resistance area connects said low resistance area to one of said first ion implantation area and said second ion implantation area.

13. The semiconductor device according to claim 11, wherein said plurality of gate electrodes comprise a first gate electrode and a second gate electrode adjacent to said first gate electrode, said high resistance area comprises a first high resistance area and a second high resistance area, said low resistance area is formed between said first gate electrode and said second gate electrode, said first high resistance area connects said low resistance area and said first ion implantation area, and said second high resistance area connects said low resistance area and said second ion implantation area.

14. The semiconductor device according to claim 11, wherein said plurality of gate electrodes comprise a first gate electrode, a second gate electrode adjacent to said first gate electrode, and a third gate electrode adjacent to said second gate electrode, said low resistance area comprises a first low resistance area and a second low resistance area, said first low resistance area is formed between said first gate electrode and said second gate electrode, said second low resistance area is formed between said second gate electrode and said third gate electrode, and said high resistance area connects said first low resistance area and said second low resistance area.

15. The semiconductor device according to claim 11, wherein the plurality of gate electrodes comprise a first gate electrode, a second gate electrode adjacent to said first gate electrode, and a third gate electrode adjacent to said second gate electrode, said low resistance area comprises a first low resistance area and a second low resistance area, said high resistance area comprises a first high resistance area and a second high resistance area, said first low resistance area is formed between said first gate electrode and said second gate electrode, said second low resistance area is formed between said second gate electrode and said third gate electrode, said first high resistance area connects said first low resistance area and said first ion implantation area, and said second high resistance area connects said second low resistance area and said second ion implantation area.

16. The semiconductor device according to claim 11, wherein said plurality of gate electrodes comprise a first gate electrode, a second gate electrode adjacent to said first gate electrode, and a third gate electrode adjacent to said second gate electrode, said low resistance area comprises a first low resistance area and a second low resistance area, said high resistance area comprises a first high resistance area, a second high resistance area, and a third high resistance area, said first low resistance area is formed between said first gate electrode and said second gate electrode, said second low resistance area is formed between said second gate electrode and said third gate electrode, said first high resistance area connects said first low resistance area and said first ion implantation area, said second high resistance area connects said second low resistance area and said second ion implantation area, and said third high resistance area connects said first low resistance area and said second low resistance area.

17. The semiconductor device according to claim 11, wherein said high resistance area comprises a plurality of high resistance areas formed between said first and second ohmic electrodes, and one of the adjacent high resistance areas out of said plurality of high resistance areas is formed on one side of said active layer, and the other high resistance area is formed on the other side of said active layer.

18. The semiconductor device according to claim 17, further comprising:

a plurality of voltage application portions for respectively applying voltages to said plurality of gate electrodes, one of the adjacent voltage application portions out of said plurality of voltage application portions being formed on one side of said active layer between said high resistance areas, and the other voltage application portion being formed on the other side of said active layer between said high resistance areas.

19. The semiconductor device according to claim 11, wherein said low resistance area is formed using ion implantation.

20. The semiconductor device according to claim 11, wherein said high resistance area is formed using ion implantation.

* * * * *